United States Patent

Nakano et al.

[11] Patent Number: 6,064,069
[45] Date of Patent: May 16, 2000

[54] SOLID STATE CAMERA ELEMENT

[75] Inventors: Takashi Nakano; Nobukazu Teranishi, both of Tokyo, Japan

[73] Assignee: NEC Corporation, Tokyo, Japan

[21] Appl. No.: 08/972,565

[22] Filed: Nov. 18, 1997

[30] Foreign Application Priority Data

Nov. 18, 1996 [JP] Japan .................................. 8-306578

[51] Int. Cl.$^7$ .................................................. G01J 1/58
[52] U.S. Cl. ........................... 250/370.08; 250/370.11; 250/483.1
[58] Field of Search .................. 250/370.08, 370.11, 250/371, 483.1; 257/225, 242; 348/248, 249

[56] References Cited

U.S. PATENT DOCUMENTS

| 4,051,374 | 9/1977 | Drexhage et al. ................... 250/370 |
| 5,294,288 | 3/1994 | Melpoder et al. ................... 156/621 |
| 5,351,081 | 9/1994 | Matsui et al. ...................... 348/249 |
| 5,510,627 | 4/1996 | Snow .................................. 257/21 |
| 5,514,888 | 5/1996 | Sano et al. ......................... 257/232 |

FOREIGN PATENT DOCUMENTS

| 59-56766 | 4/1984 | Japan . |
| 62-86857 | 4/1987 | Japan . |
| 4-322467 | 11/1992 | Japan . |
| 4-326763 | 11/1992 | Japan . |
| 5-93780 | 4/1993 | Japan . |

*Primary Examiner*—Constantine Hannaher
*Assistant Examiner*—Albert Gagliarol
*Attorney, Agent, or Firm*—Hutchins, Wheeler & Dittmar

[57] ABSTRACT

A solid state camera element having photodiode provided on a matrix and shielding film formed in the layer above the circumference of photodiode, wherein fluorescence film is provided in the layer above any one of photodiodes or in the layer above photodiode, extending from the top surface to the lower layer of shielding film. Interference filter of one or multiple layers is provided in the layer above fluorescence film for transmitting an absorption wavelength and reflecting a luminescence wavelength of the fluorescence film. Also, N well of photodiode is formed deep in the substrate and the peak wavelength of sensitivity is shifted to a longer wavelength side from the normal setting peak value of 550 nm. Therefore, the present invention can enhance the blue sensitivity of the solid state camera element by using fluorescent pigment without causing cross talk with a neighboring photodiode.

20 Claims, 5 Drawing Sheets

SOLID STATE CAMERA ELEMENT

BACKGROUND OF THE INVENTION

1. Field of the Invention

The present invention relates to the a structure of films above photodiodes of a solid state camera element.

2. Description of the Related Art

Hitherto, as shown in Japanese Patent Laid-open No. 326763/1992 publication, a fluorescence film is used above a photodiode of a solid state camera element to increase blue sensitivity. FIG. 1 illustrates the structure of a photodiode of a solid state camera element shown in the Japanese Patent Laid-open No. 326763/1992. In this example of the prior art, a photodiode 27 is provided on silicon substrate 26, and protection film 28 and fluorescence film 29 are formed on the photodiode 27, successively. The fluorescence film 29 has an absorption area in a desired wavelength zone of which sensitivity improvement is intended, and hence it emits light on the longer wavelength side of the desired wavelength zone, the longer wavelength side corresponding to the high sensitivity wavelength of photodiode 27. Since there are large differences in refractive index between the silicon substrate 26 on which the photodiode is formed and the silicon oxide film interface, and blue sensitivity is largely lowered due to the reflection and scattering of light in the interfaces, light is converted to light having longer wavelength by means of fluorescent pigment before the blue light is damped in the interfaces between the silicon substrate and the oxide film to improve blue sensitivity. Also in a solid state camera element, into which signals are inputted from the rear side, blue color is largely damped when it is inputted into the substrate on which sensors are formed, and hence blue sensitivity is improved by providing a fluorescence film on the rear side.

Also, as shown in Japanese Patent Laid-open No. 322467/1992, in the case that there is shown in FIG. 2 a solid state camera element in which microlens 33 is formed in the upper part of the element as shown in FIG. 1 to collect signals on a photodiode 31, fluorescent pigment is mixed into a microlens 33 and further a layer of fluorescence reflection film 34 is formed on the fluorescence film 33. The fluorescence reflection film 34 reflects luminescence wavelength light of microlens 33, and it enables the fluorescence, which does not enter photodiode 31, to enter photodiode 31, efficiently.

In the structure illustrated in FIG. 1, as shown in Japanese Patent Laid-open 326763/1992, since fluorescence is emitted in all directions, fluorescence emitted in a direction, in which it is not allowed to be applied to photodiode 27 becomes a loss and also when it enters the adjacent photodiode, it becomes an error signal so that the resolution is deteriorated.

Further, when fluorescence pigment is mixed with microlens 33 as illustrated in FIG. 2, and in Japanese Patent Laid-open 322467/1992, distribution of the refractive index becomes irregular because of the uneven density of fluorescence pigment in microlens 33, resulting in the lowered efficiency in condensing light to photodiode 31. One layer of fluorescence reflection film 34 also can not produce large effects.

Further, if the reflected light from fluorescence reflection film 34 enters a neighboring photodiode, it produces an error signal, deteriorating the resolution of images.

SUMMARY OF THE INVENTION

It is an object of the present invention to efficiently enhance, without producing cross talk, blue sensitivity of a solid state camera element by using fluorescence pigment. This object is achieved according to a structure of the present invention described below. In other words, it is achieved according to the structure of the present invention which comprises, 1. The solid state camera element has a plurality of photoreceptors (photodiode) arranged in the form of matrix, and a shielding film is provided between adjacent photoreceptors, that is, the shielding film is provided over the area around a photoreceptor, and a wavelength converter (fluorescence film) is provided in a layer over photoreceptors or in an upper layer of photoreceptors but under the top surface of the shielding film.

2. The solid state camera element which includes an interference filter for transmitting absorption wavelength and reflecting a fluorescence wavelength of the wavelength converter, the interference filter being composed of one or more layers disposed in the layer above the wavelength converter.

3. The solid state camera element for a visible range having photoreceptors each composed of a photodiode, wherein the photodiode is formed in the substrate so as to reach a deep point thereby shifting the peak wavelength of sensitivity to the longer wavelength side as compared to the peak wavelength of a spectral luminous efficiency.

DETAILED DESCRIPTION OF THE PREFERRED EMBODIMENTS

Figure 1:
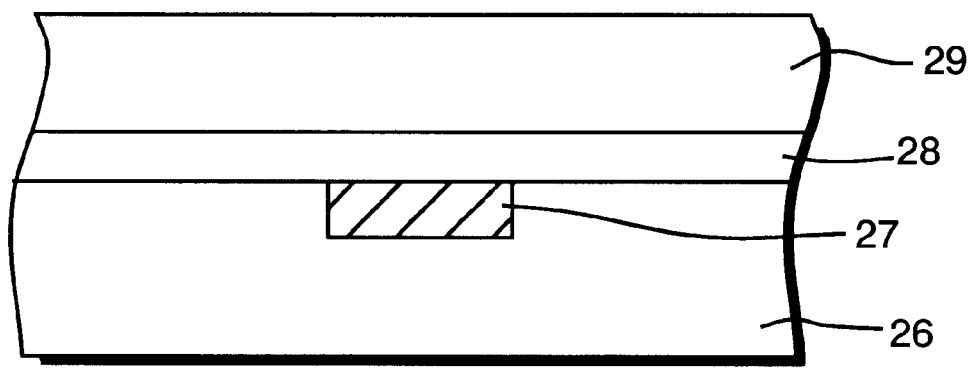
FIG. 1 shows a structure of a photodiode portion of the conventional solid state camera element.
Figure 2:
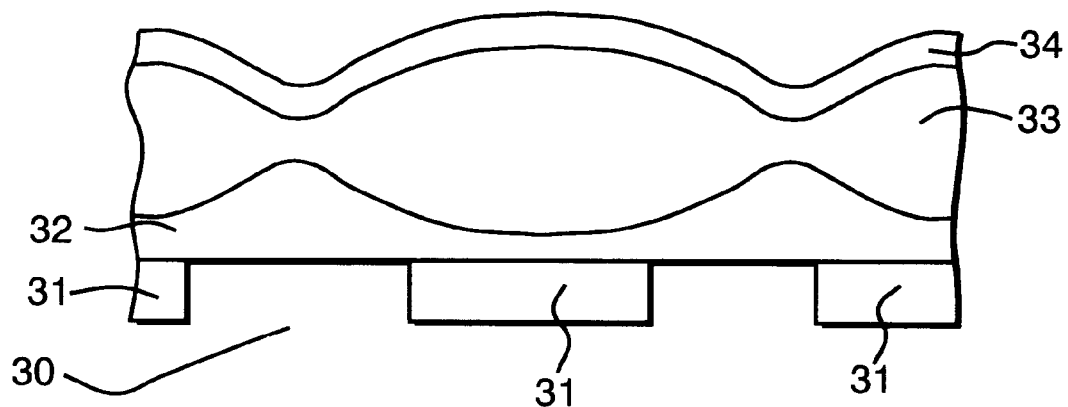
FIG. 2 shows a structure of a photodiode of the conventional solid state camera element.
Figure 3:
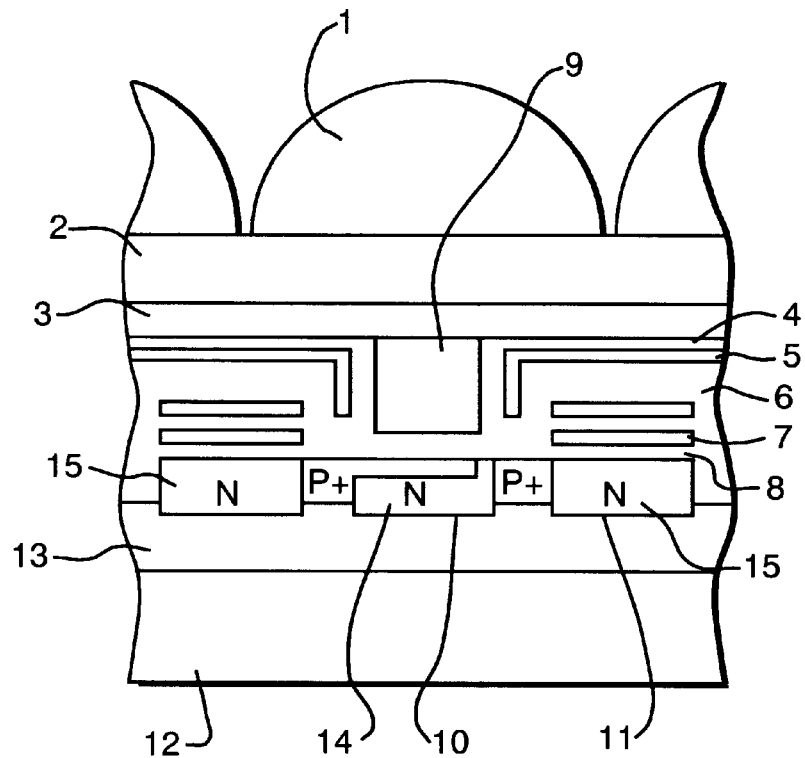
FIG. 3 shows a partial sectional view of an embodiment of the solid st ate camera element of the present invention.
Figure 4:
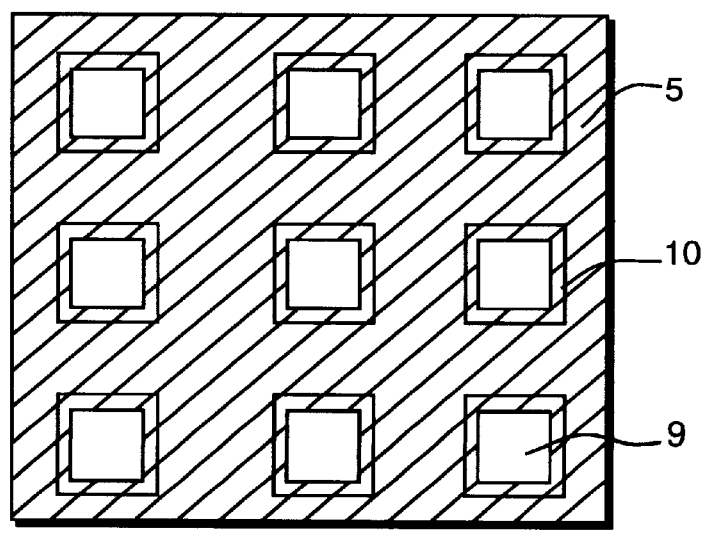
FIG. 4 is a plan of the solid state camera element of FIG. 1.

FIG. 3 shows an embodiment of a solid state camera element of the present invention. In the solid state camera element, fluorescence film 9, which serves as a wavelength converter, is embedded between shielding films 5 above a photodiode 10, which serves as a photoreceptor, and above which a fluorescence reflection film 3 which transmits the light signal of the absorption wavelength and reflects the light signal of the luminescence wavelength, both from the fluorescence pigment, is formed as an interference filter. FIG. 3 shows that the film 5 includes two portions: a first portion substantially parallel to the substrate and a second portion that is substantially perpendicular to the substrate, where the second portion is closer to the photodiode 10 than the first portion. FIG. 4 shows a plan of an example of the solid state camera element. Generally, shielding film 5 is provided above the circumference of photodiode 10 which serves as a photoreceptor of the solid state camera element in order to reduce spurious signals such as a smear incident to the area other than photodiode 10. Therefore, by embedding fluorescence film 9 between shielding film 5, cross talk to be generated between a neighboring photodiode being caused by fluorescence emitted in every direction can be prevented.

A manufacturing method of the solid state camera element is shown below. With the solid state camera element, generally shielding film 5 is first formed and then cover film 4 (protection film) is formed. In the present invention, thereafter, fluorescence film 9 is formed only between shielding films 5, or after forming fluorescence film 9 on shielding film 5, fluorescence film 9 formed above shielding film 5 is removed by such etch-back technique. Then, a fluorescence reflection film 3 in which a signal of a fluorescent pigment absorption wavelength is transmitted and a signal of a fluorescent pigment luminescence wavelength is reflected is formed as interference filter 3. Succeedingly, as with a general solid state camera element, leveling layer 2 is formed and, if necessary, microlens 1 is formed.

Further, if the reflection factor of fluorescence reflection film 3 for a fluorescent pigment luminescence wavelength is increased, it can be used as a blue sensor of a 3-plate type color camera. If the reflection factor is held in a reasonable range not too large, it becomes possible to form a solid state camera element which can be used in the whole wavelength range having the blue sensitivity which is better than conventional one. Further, when it is used as the 3-plate type blue sensor, the blue sensitivity can further be increased by forming N well of photodiode 10 into a deep position.

Although a description has been made with reference to improvement of the blue sensitivity, the red sensitivity of the solid state camera element can be enhanced without causing cross talk with a neighboring photodiode by using, instead of fluorescence film 9, an IR converter (as a wavelength converter) such as used for detection of light emitted from YAG (yttrium aluminum garnet) laser, which absorbs red light and emits green light.

Figure 9:
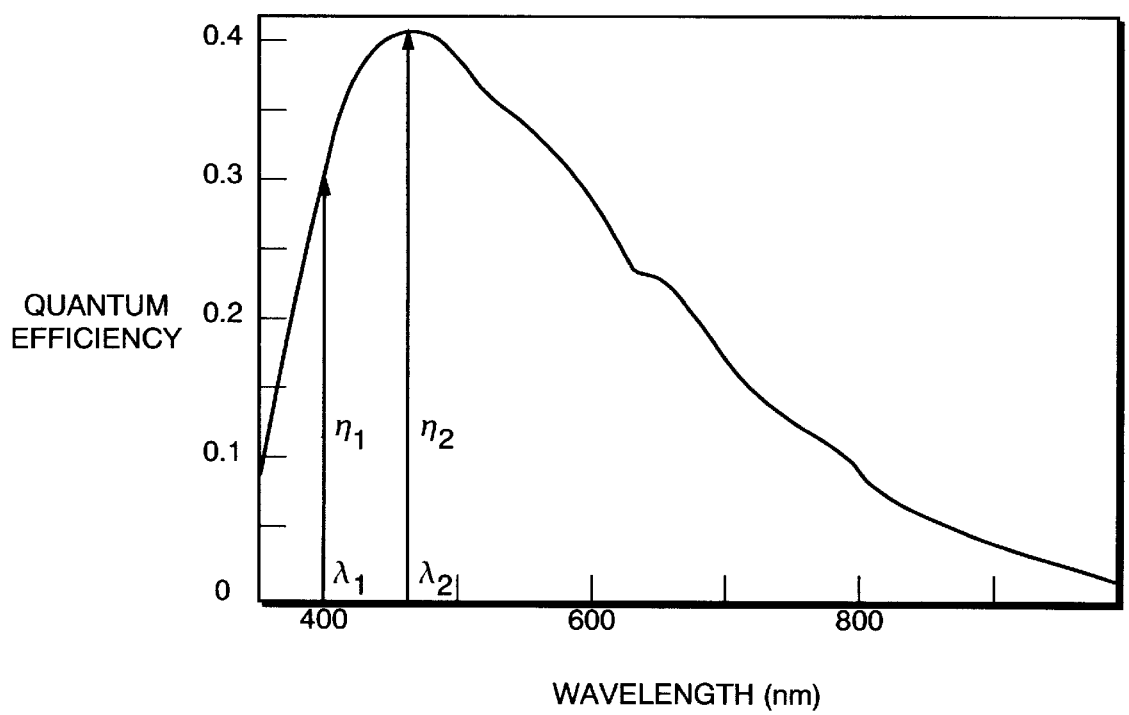
FIG. 9 is a diagram showing an example of the spectral quantum efficiency of the solid state camera element.

Now, it will be described with reference to the function of the solid state camera element. FIG. 9 shows an example of spectral quantum efficiency of CCD (charged coupled device). It is assumed, concerning applicable fluorescent pigment, that absorption wavelength is $\lambda_1$ nm, luminescence wavelength $\lambda_2$ nm and luminescence efficiency (amount of luminescence/amount of incident rays) $\alpha$. Since fluorescence from fluorescent pigment will be emitted in all direction, it is assumed that among the fluorescence, $\beta$ reaches a photodiode. Further, quantum efficiency of the photodiode at the absorption wavelength is expressed by $\eta_1$, at the luminescence wavelength by $\eta_2$ and it will be discussed about a signal of the absorption wavelength. When fluorescent pigment is applied on the photodiode, blue signals of $\alpha \cdot \beta \cdot \eta_2$ reach the photodiode, whereas when fluorescent pigment is not applied, only blue signals of $\eta_1$ reach the photodiode. Therefore, if $$\alpha \cdot \beta \cdot \eta_2 / \eta_1 > 1 \qquad (1)$$

then, the blue sensitivity becomes larger when fluorescent pigment is applied.

Next, it will be discussed about the fluorescence reflection film. This film increases the value of $\beta$ in equation (1). The fluorescence reflection film, which transmits a fluorescent pigment signal of the absorption wavelength and reflects a fluorescent pigment signal of the luminescence wavelength, represents the interference filter film. Of the fluorescent pigment caused light emitted in all direction, the light emitted in the reverse direction of the photodiode is caused to enter the photodiode, by forming the interference filter on the fluorescence film.

Figure 7:
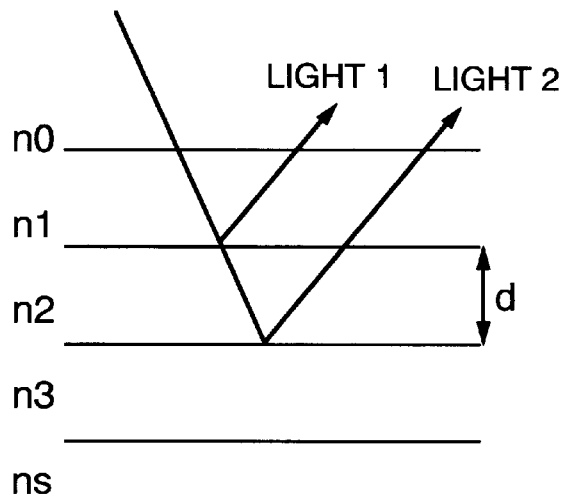
FIG. 7 shows a structure of an interference filter of the present invention.

In the multilayer film as shown in FIG. 7, the refractive index of each film is expressed as $n_1$, $n_2$, $n_3$ from above in order, thickness of the center film d, incident beam wavelength $\lambda$. When $n_2 > n_1$, $n_2 > n_3$, the phase of beam 1 and beam 2 slips to each other by $\pi$ at the time of reflection, therefore, $d = m \cdot \lambda / 4 n_2$ m: odd number, reflection is promoted, $d = m \cdot \lambda / 4 n_2$ m: even number, reflection is restrained. (A)

Figure 8:
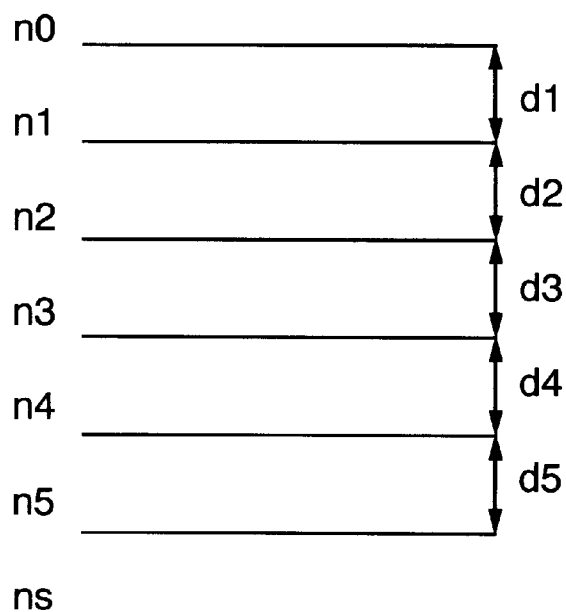
FIG. 8 shows a structure of an interference filter of the present invention.

Accordingly, by adjusting the film thickness d, it is possible to promote reflection at wavelength $\lambda_1$, and restrain reflection at wavelength $\lambda_2$. However, since the strength of reflection is determined by the difference of the refractive index, the strength of reflection can not be changed with this structure without changing the kind of film. But, if it takes a multilayer film structure with an increased number of layers as shown in FIG. 8, and sets the thickness of the i-th film to the thickness in which reflection is controlled to nearly zero at a wavelength $\lambda_1$ and reflection is increased at a wavelength $\lambda_2$ and further if multiple reflection is neglected, it is possible to increase only the reflection at the wavelength $\lambda_2$ while controlling the reflection at the wavelength $\lambda_1$ to nearly zero. It is considered easy to produce this structure by alternately overlapping two kinds of films.

Figure 5:
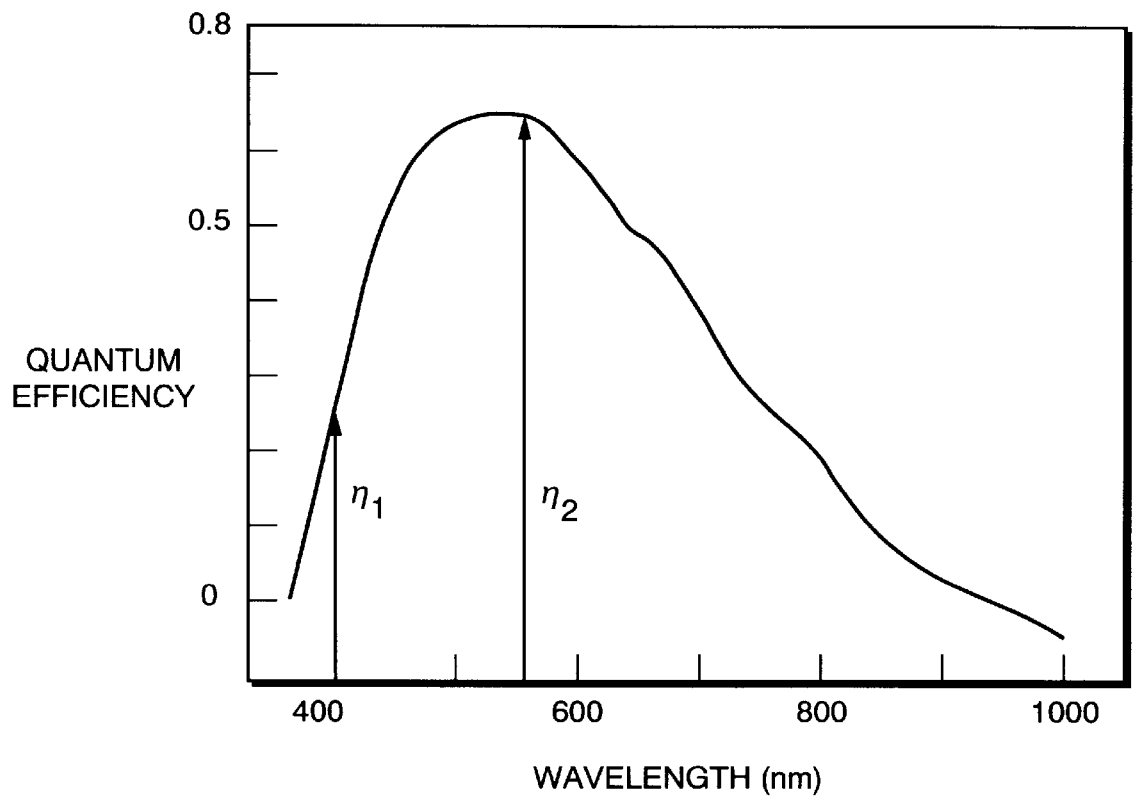
FIG. 5 is a diagram showing spectral quantum efficiency of the photodiode of the present invention.

Next, FIG. 5 again shows spectral quantum efficiency of CCD. Generally, since the peak value of the spectral sensitivity of CCD is set corresponding to wavelength 550 nm in accordance with the spectral luminous efficiency, the wavelength corresponding to the peak spectral quantum efficiency is about 460 nm as shown in FIG. 9. In this case, the depth of the photodiode is approximately 1 μm. However, in this case, as seen from FIG. 9, the value of $\eta_2/\eta_1$ of equation (1) is small. FIG. 5 shows spectral quantum efficiency obtained by forming a N well of the photodiode which reaches a deeper position and shifting the peak of sensitivity to the long wavelength side to enlarge the value of $\eta_2/\eta_1$. By using CCD of this characteristic, further improvement of the blue sensitivity will be attained. Luminescence efficiency $\alpha$ of equation (1) is determined depending upon fluorescent pigment to be used.

With reference to cross talk, the cross talk with a neighboring photodiode can be eliminated by embedding a fluorescence film between shielding films of CCD as shown in the drawings of the embodiment.

When fluorescent pigment is mixed in the film, there is a problem that the distribution of refractive index is unstable because of the irregular density distribution of the fluorescent pigment. When the fluorescent pigment is mixed in the microlens, there occurs a problem because the microlens must condense the light, however in the present embodiment, the fluorescent pigment is mixed in the film which does not condense the light, accordingly there occurs no problem.

FIG. 3 shows an embodiment of the present invention. It is to be noted that a shielding film is formed in the layer above the circumference of each photodiode, as shown in FIG. 4. On Si substrate (N-substrate) 12 which constitutes a semiconductor substrate, there is formed P well 13, and on which N well 14 of photodiode 10 and N well 15 of charge transfer CCD 11 are formed. On CCD 11, there are formed, from below to above in order, gate oxide film (SiO$_2$) 8, gate electrode (n dope polysilicon) 7, interlayer oxide film (SiO$_2$) 6, and further above them, shielding film (tungsten or aluminum) 5 and cover film (SiO$_2$) 4 are formed so as to cover the CCD portion, and still further in the above layer, fluorescence reflection film 3 which serves as an interference filter and leveling film (SiO$_2$ or resin) 2 are formed. Above photodiode 10, SiO$_2$ film such as interlayer oxide film 6, cover film 4 are formed, and above which fluorescence film 9 is formed so as to be filled between shielding films 5. Further above them, there are formed fluorescence reflection film 3, leveling film 2 and microlens 1.

N well 14 of the photodiode is formed so as to reach a deeper position than usual, and has the spectral quantum efficiency as shown in FIG. 5. As the fluorescent pigment of fluorescence film 9, lumogen 410 (trade name) of absorption wavelength 400 nm, luminescence wavelength 550 nm is used.

Fluorescence film 9 is formed in such a process that Pyralin (a kind of polyimide resin) mixed with fluorescent pigment is applied to cover film 4 by using spinner after forming cover film 4 to dry it in an oven, following which etch back treatment is applied to remove Pyralin in the layer above the top surface of shielding film 5. The substance formed above photodiode 10 are all transparent and have refractive indexes each of which being approximately 1.46. The Pyralin mixed with the fluorescent pigment and applied to fluorescence film 9 is also transparent with the refractive index of approximately 1.46.

Fluorescence reflection film 3 is required to transmit a fluorescence absorption wavelength of 400 nm and reflect a fluorescence luminescence wavelength of 550 nm. Now it is considered, as a structure of fluorescence reflection film 3, that silicon nitride film of the refractive index of 2 and an silicon oxide film of the refractive index of 1.46 are overlapped alternately to form a multiple layer film. For example, the above structure is such that, in FIG. 8, the odd number film is a nitride film and the even number film is an oxide film, $n_O$ one is a leveling film 2, and $n_s$ one is fluorescence film 9. The refractive indexes of the substance on both ends of fluorescence reflection film $n_O$, $n_s$ are both 1.46.

As for the thickness of each layer of the multiple fluorescence reflection film of this like, when film thickness of a nitride film having a refractive index of 2 is set to 200 mm according to conditions of the above (A), then the degree m becomes 2 for a signal of wavelength 400 nm and becomes 3 for a signal of wavelength 550 nm, and the reflection of the wavelength is controlled for the wavelength of 400 nm and promoted for the wavelength of 550 nm. With reference to the oxide film having the refractive index of 1.46, when the film thickness is determined as 260 nm, then the degree m becomes 2 for a signal of wavelength 100 nm and becomes 3 for a signal of wavelength 550 nm, and as above, the reflection of the wavelength is controlled for the wavelength of 400 nm and promoted for the wavelength of 550 nm.

Therefore, when a nitride film of refractive index 2 with wavelength 200 nm and an oxide film of refractive 1.46 with wavelength 260 nm are overlapped alternately, reflection is controlled for the film of wavelength 400 nm and promoted for the film of wavelength 550 nm, and thus a fluorescence reflection film can be formed of which reflection power is controlled by the number of overlapped films.

Figure 6:
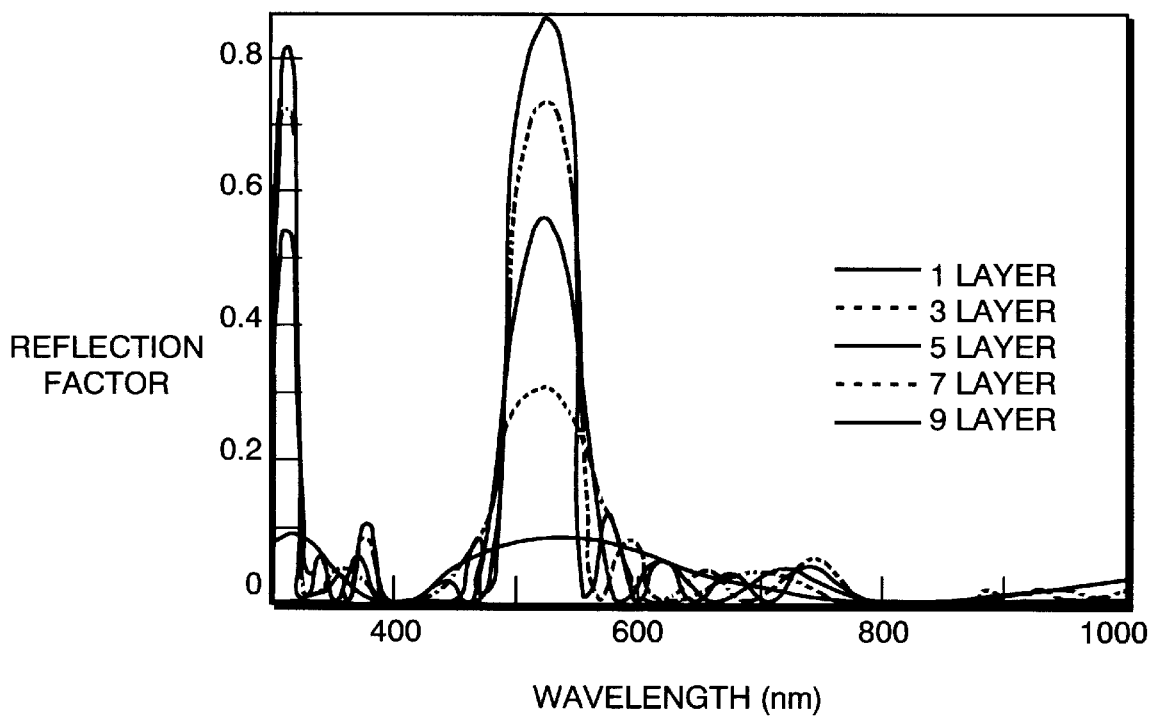
FIG. 6 is a diagram showing the reflection factor of a multilayer film interference filter of the present invention.

FIG. 6 shows the reflection factor of this multilayer fluorescence reflection film when the number of its layer is 1, 3, 5, 7, and 9. Here, the number of layer 5 means, in FIG. 8, the case in which an odd number one is a nitride film, an even number one is an oxide film, $n_O$ number one is a leveling film 2, and $n_s$ number one is fluorescence film 9. In FIG. 6, the reflection factor for the wavelength 400 nm is nearly 0, so that, as the number of layers increases, reflection for the wavelength 550 nm is increased while maintaining the reflection for the wavelength 400 nm in a small value.

Now, α of lumogen 410 is 0.8, and according to FIG. 6, β can be made 0.83 by attaching it to fluorescence reflection film 3 composed of 9 films. Further, according to FIG. 5, $\eta_2/\eta_1$ becomes nearly 2.2. In this case, the value of the left side of equation (1) is 1.46, this means that the blue sensitivity is increased by 46% by using fluorescent pigment.

As described above, the present invention can prevent the cross talk between neighboring photodiodes and have the effect of efficiently increasing the blue sensitivity of the solid state camera element, by providing a shielding film in such a manner to surround the area above each photodetector, by together embedding a fluorescence film above the photodiode between shielding films, and by further providing a filter above the fluorescence film for transmitting the absorption wavelength and reflecting the luminescence wavelength of the fluorescence film.

What is claimed is:
1. A solid state camera element comprising:
   a plurality of photoreceptors arranged on a substrate in the form of a matrix,
   a shielding film formed in a layer above an area between adjacent photoreceptors in such a manner that the shielding film surrounds the periphery of each of said photoreceptors, said shielding film including a first portion substantially parallel to said substrate and a second portion substantially perpendicular to said substrate, wherein said second portion is disposed closer to a respective one of said photoreceptors than said first portion, and
   a wavelength converter provided in a layer above said respective one of said photoreceptors or in a layer above said respective one of said photoreceptors, so as to extend from a top surface of the shielding film to a lower layer of said shielding film, wherein said converter is formed only between said portions of said shielding layer.

2. A solid state camera element according to claim 1 wherein, a filter is provided in the upper layer of said wavelength converter, said filter transmitting an absorption wavelength and reflecting a luminescence wavelength of said wavelength converter.

3. A solid state camera element according to claim 2, wherein each photoreceptor is composed of a photodiode having a junction positioned at a depth in said substrate so that the peak wavelength of sensitivity is shifted to a longer wavelength side from the peak wavelength of spectral luminous efficiency curve.

4. A solid state camera element according to claim 1, wherein each photoreceptor is composed of a photodiode having a junction positioned at a depth in said substrate so that the peak wavelength of sensitivity is shifted to a longer wavelength side from the peak wavelength of spectral luminous efficiency curve.

5. A solid state camera element, comprising,
   a photoreceptor carried by a substrate,
   a shielding film formed above said photoreceptor, said shielding film having a first portion substantially parallel to said substrate and a second portion substantially perpendicular to said substrate, wherein said second portion is disposed closer to said photoreceptor than said first portion, and
   a wavelength converter disposed only between said portions of said shielding film and having a portion located above said photoreceptor, whereby a wavelength generated by said wavelength converter is received by said photoreceptor.

6. A solid state camera element according to claim 5, wherein said wavelength converter comprises a film containing a fluorescent material.

7. A solid state camera element according to claim 5, wherein said second portion of said shielding film includes extends from said first portion toward said photoreceptor.

8. A solid state camera element according to claim 7, wherein said wavelength converter comprises an embedded film disposed adjacent and across from said downwardly extending portion of said shielding film.

9. A solid state camera element according to claim 5, further comprising an interference filter provided in a layer disposed above said wavelength converter.

10. A solid state camera element according to claim 9, wherein said interference filter comprises multiple layers of selected film materials having predetermined characteristics of refractive index.

11. A solid state camera element according to claim 5, wherein said wavelength converter includes an IR converter capable of absorbing red light and emitting green light.

12. A solid state camera element according to claim 5, further comprising a microlens.

13. A solid state camera element comprising,
  a photoreceptor carried on a substrate,
  a shielding film formed in a layer above and adjacent said photoreceptor to allow said shielding film to surround substantially a periphery of said photoreceptor, said shielding film including a first portion substantially parallel to said substrate and a second portion substantially perpendicular to said substrate, wherein said second portion is disposed closer to said photoreceptor than said first portion,
  a wavelength converter for providing a selected luminesence wavelength and being disposed above said photoreceptor and adjacent said shielding film, said wavelength converter being formed only between said portions of said shielding film, and
  a fluorescent reflection film disposed above said wavelength converter and having a reflection factor adapted to increase reflection of said luminesence wavelength.

14. A solid state camera element according to claim 13, wherein said photoreceptor comprises a photodiode formed sufficiently deep within said substrate to increase sensitivity for said luminesence wavelength.

15. A solid state camera element according to claim 13, wherein said wavelength converter includes a fluorescent material capable of generating a luminesence wavelength suitable for providing enhanced blue sensitivity.

16. A method for forming a solid state camera element, comprising,
  providing a substrate having a photoreceptor formed thereon,
  forming a shielding film having a first portion lying in a layer above said photoreceptor and having a second portion extending downwardly from said layer and towards said photoreceptor, said second portion being closer to said photoreceptor than said first portion, and
  providing a wavelength converter at a location only between said first and second portions and above and adjacent to said photoreceptor and adjacent said shielding film, and being adapted to generate a selected wavelength of light.

17. A method for forming a solid state camera element, according to claim 16 further including providing a filter in an upper layer of said wavelength converter.

18. A method for forming a solid state camera element, according to claim 16, further including providing a reflection film above said wavelength converter for reflecting said selected wavelength toward said photoreceptor.

19. A method for forming a solid state camera element according to claim 16, further including forming said photoreceptor as a photo diode formed sufficiently deep within said substrate to enhance sensitivity for said selected wavelength.

20. A method for forming a solid state camera element according to claim 16, further including providing above said wavelength converter as a multiple layer film, wherein each layer each has a selected index of refraction, to provide thereby a fluorescence reflection film adapted for reflecting a selected range of wavelengths.

* * * * *